(12) United States Patent
Park et al.

(10) Patent No.: US 12,010,879 B2
(45) Date of Patent: Jun. 11, 2024

(54) TRANSPARENT DISPLAY DEVICE

(71) Applicant: LG Display Co., Ltd., Seoul (KR)

(72) Inventors: Sunyoung Park, Paju-si (KR); Taehee Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 387 days.

(21) Appl. No.: 17/530,099

(22) Filed: Nov. 18, 2021

(65) Prior Publication Data

US 2022/0165819 A1 May 26, 2022

(30) Foreign Application Priority Data

Nov. 24, 2020 (KR) .......................... 10-2020-0158912

(51) Int. Cl.
| | |
|---|---|
| *H10K 59/123* | (2023.01) |
| *H10K 50/81* | (2023.01) |
| *H10K 59/121* | (2023.01) |
| *H10K 59/126* | (2023.01) |
| *H10K 59/131* | (2023.01) |
| *H10K 59/80* | (2023.01) |
| *H10K 71/00* | (2023.01) |

(52) U.S. Cl.
CPC ........... *H10K 59/123* (2023.02); *H10K 50/81* (2023.02); *H10K 59/121* (2023.02); *H10K 59/131* (2023.02); *H10K 59/8051* (2023.02); *H10K 59/126* (2023.02); *H10K 71/861* (2023.02)

(58) Field of Classification Search
CPC .... H10K 59/123; H10K 50/81; H10K 59/131; H10K 59/126; H10K 59/8051; H10K 59/121
See application file for complete search history.

(56) References Cited

U.S. PATENT DOCUMENTS

2021/0200366 A1* 7/2021 Bok ..................... H10K 59/122
2023/0053234 A1* 2/2023 Uhm .................. H10K 59/1213

* cited by examiner

*Primary Examiner* — David Vu
*Assistant Examiner* — Brandon C Fox
(74) *Attorney, Agent, or Firm* — Seed IP Law Group LLP

(57) ABSTRACT

A transparent display device may minimize or reduce coupling occurring between signal lines and apply a repair structure to a scan line. The transparent display device comprises a substrate provided with a transmissive area and a plurality of subpixels disposed between the transmissive areas, first and second anode electrodes provided in each of the plurality of subpixels, a first connection electrode connecting the first anode electrode with the second anode electrode, a driving transistor provided in each of the plurality of subpixels, and a second connection electrode provided below the driving transistor, electrically connecting the driving transistor with the first connection electrode.

15 Claims, 9 Drawing Sheets

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors of the present disclosure have recognized that in a transparent display device, a short may occur between an anode electrode and a cathode electrode due to particles. For this reason, a dark spot may occur. Since the transparent display device includes a light emission area smaller than that of a general display device, a light loss rate caused by occurrence of the dark spot may be increased.

The present disclosure has been made in view of various technical problems including the above problems, and various embodiments of the present disclosure provide a transparent display device that may reduce or minimize a light loss rate caused by occurrence of a dark spot.

It is another technical benefit of the present disclosure to provide a transparent display device that may reduce or minimize deterioration of transparency due to a repair line.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with a transmissive area and a plurality of subpixels disposed between the transmissive areas, first and second anode electrodes provided in each of the plurality of subpixels, a first connection electrode connecting the first anode electrode with the second anode electrode, a driving transistor provided in each of the plurality of subpixels, and a second connection electrode provided below the driving transistor, electrically connecting the driving transistor with the first connection electrode.

In accordance with another aspect of the present disclosure, the above and other technical benefits can be accomplished by the provision of a transparent display device comprising a substrate provided with a transmissive area and a plurality of subpixels disposed between the transmissive areas, first and second anode electrodes provided in each of the plurality of subpixels, a first connection electrode connecting the first anode electrode with the second anode electrode, a driving transistor provided in each of the plurality of subpixels, and a second connection electrode disposed outside the first connection electrode, electrically connecting the driving transistor with the first connection electrode.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
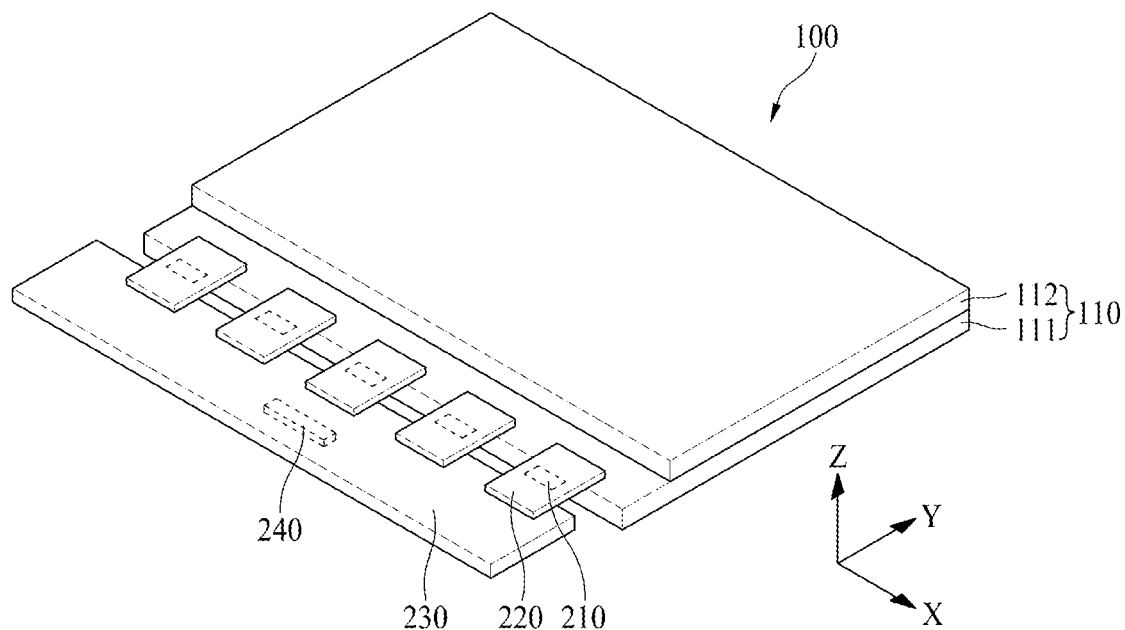
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X-axis indicates a line parallel with a scan line, Y-axis indicates a line parallel with a data line, and Z-axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in the pad area PA of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
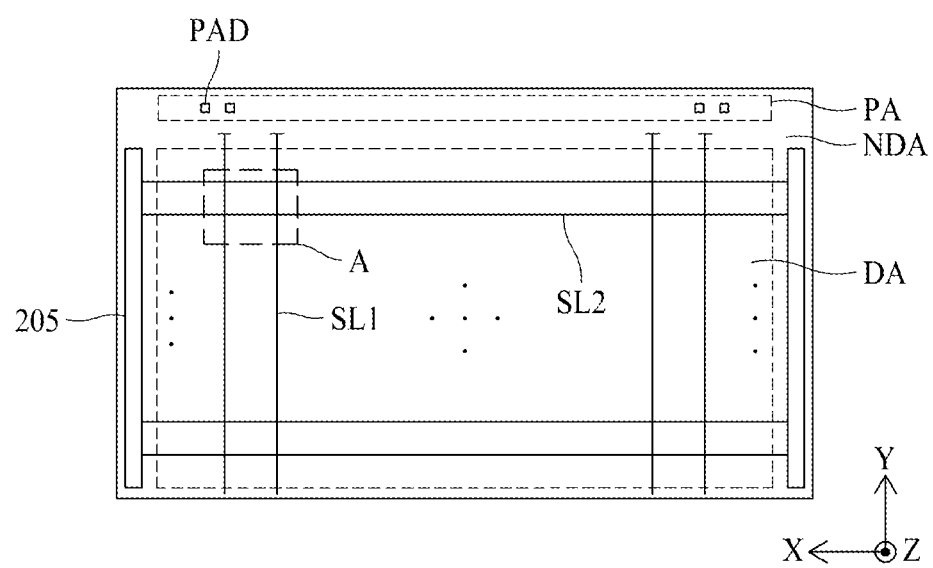
FIG. 2 is a schematic plane view illustrating a transparent display panel according to one embodiment of the present disclosure.
Figure 3:
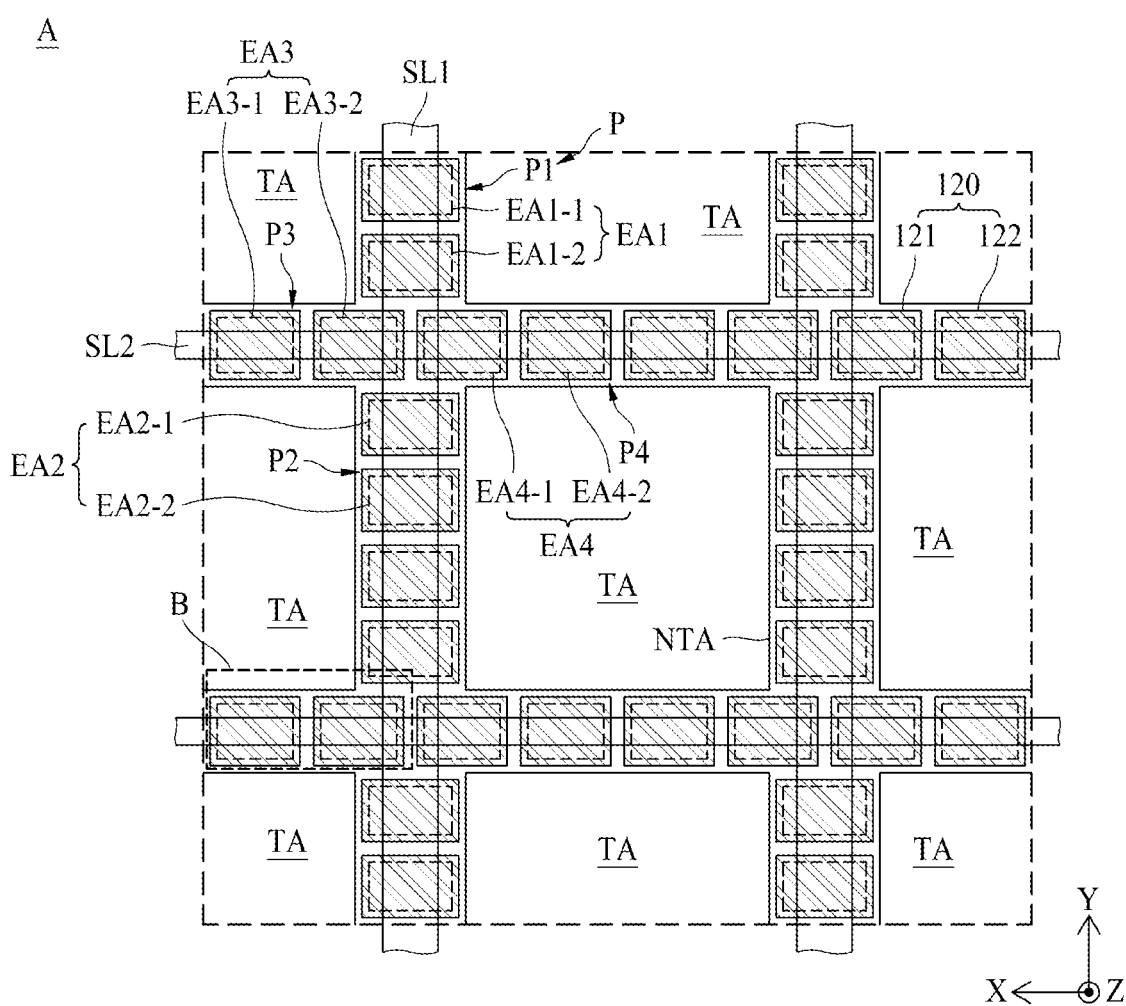
FIG. 3 is an enlarged view illustrating an area A of FIG. 2.
Figure 4:
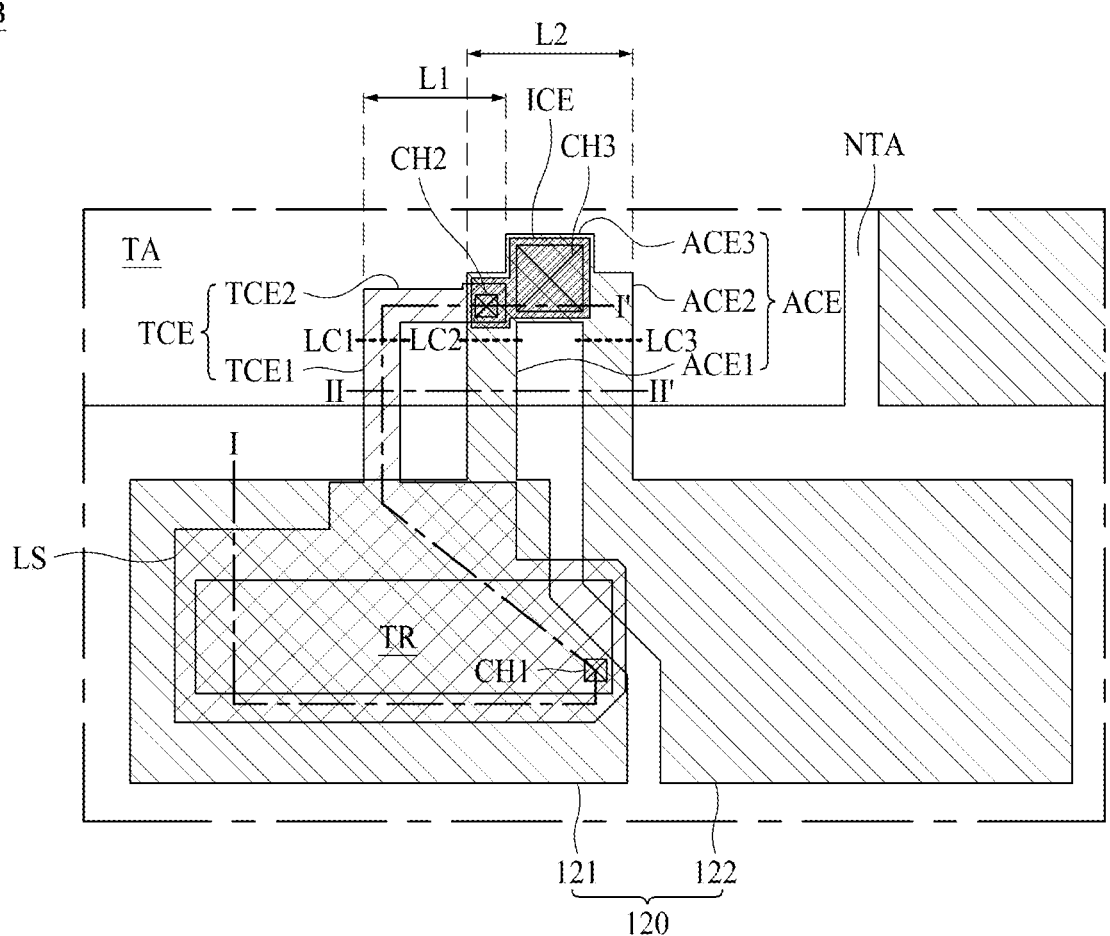
FIG. 4 is an enlarged view illustrating an area B of FIG. 3.
Figure 5:
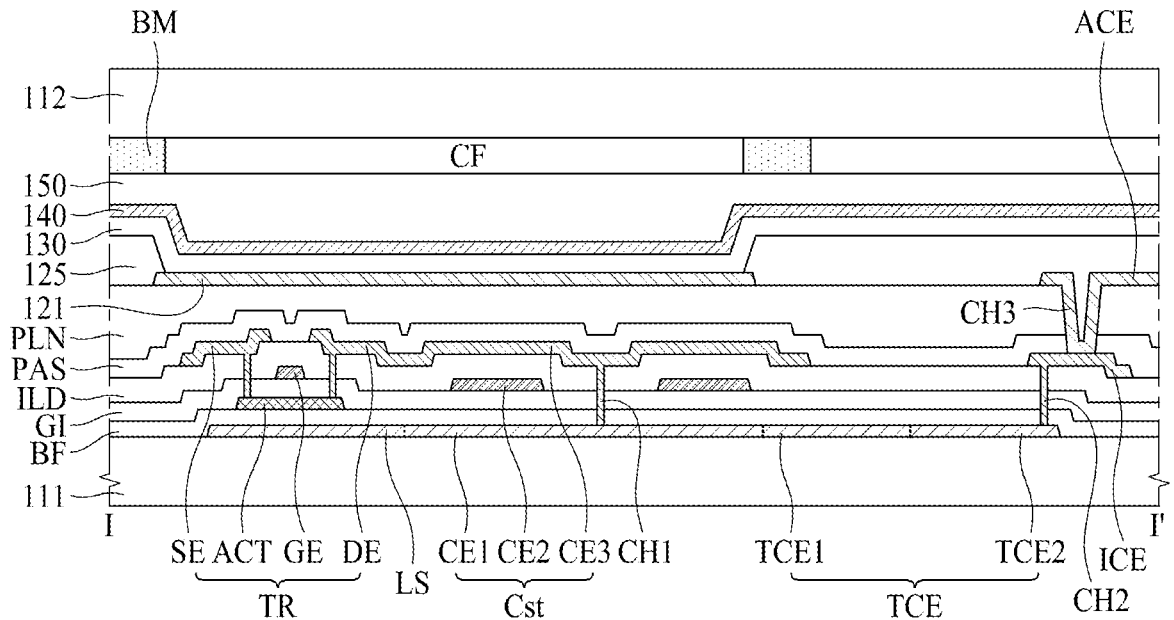
FIG. 5 is a cross-sectional view taken along line I-I' of FIG. 4.
Figure 6:
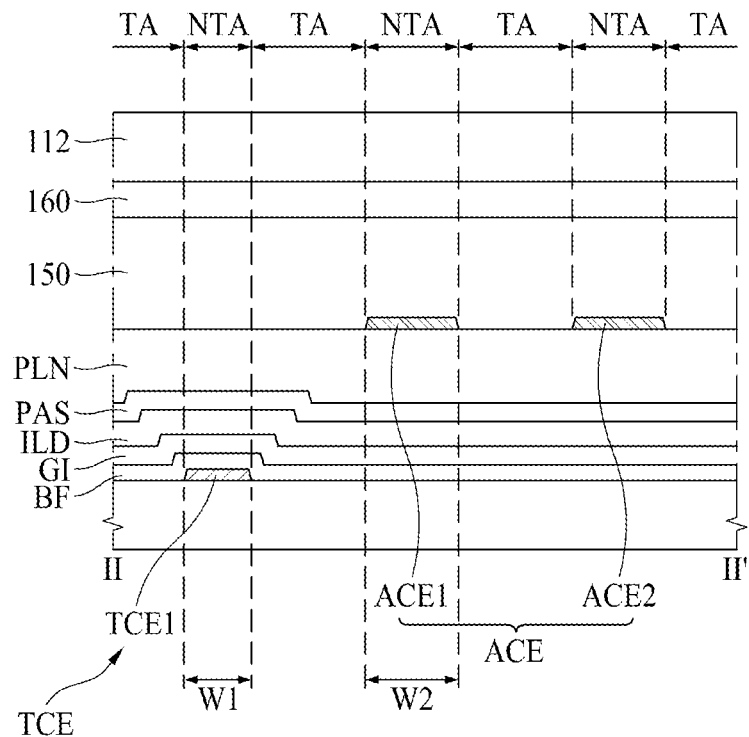
FIG. 6 is a cross-sectional view taken along line II-II' of FIG. 4.

FIG. 2 is a schematic plane view illustrating a transparent display panel according to one embodiment of the present disclosure, FIG. 3 is an enlarged view illustrating an area A of FIG. 2, FIG. 4 is an enlarged view illustrating an area B of FIG. 3, FIG. 5 is a cross-sectional view taken along line I-I' of FIG. 4, and FIG. 6 is a cross-sectional view taken along line II-II' of FIG. 4.

Referring to FIG. 2 and FIG. 6, a transparent display panel 110 may include into a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be formed in both side of the display area DA of the transparent display panel 110, but these scan drivers are not limited thereto. The scan driver 205 may be formed only in one side of the display area DA of the transparent display panel 110.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than $\alpha$ %, for example, about 90%, and the non-transmissive area NTA may be an area where light transmittance is smaller or less than $\beta$%, for example, about 50%. At this time, $\alpha$ is greater than $\beta$. A user may view an object or background arranged over a rear surface of the transparent display panel 110 due to the transmissive area TA.

A non-transmissive area NTA may be provided with a plurality of pixels P and a plurality of first signal lines SL1 and a plurality of second signal lines SL2 for supplying a signal to each of the plurality of pixels P.

A plurality of first signal lines SL1 may be extended in a first direction (e.g., Y-axis direction). A plurality of second signal lines SL2 may be extended in a second direction (e.g., X-axis direction). The plurality of second signal lines SL2 may cross or overlap the plurality of first signal lines SL1.

A transmissive area TA may be disposed between the first signal lines SL1 adjacent to each other. The transmissive area TA may also be disposed between the second signal lines SL2 adjacent to each other. That is, the transmissive area TA may be surrounded by two first signal lines SL1 and two second signal lines SL2.

Pixels P may be provided to overlap at least one of the first signal line SL1 and the second signal line SL2, thereby emitting predetermined light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a green color. The second subpixel P2 may include a second emission area EA2 emitting light of a red color. The third subpixel P3 may include a third emission area EA3 emitting light of a blue color. The fourth subpixel P4 may include a fourth emission area EA4 emitting light of a white color. However, the emission areas are not limited to this example. Each of the pixels P may further include a subpixel emitting light of a color other than red, green, blue and white. Also, the arrangement order of the subpixels P1, P2 and P3 may be changed in various ways.

Meanwhile, light emission areas EA1, EA2, EA3 and EA4 respectively provided in a plurality of subpixels P1, P2, P3 and P4 may include light emission areas divided into a plurality of areas. In detail, the first light emission area EA1 provided in the first subpixel P1 may include two divided areas, that is, a first divided light emission area EA1-1 and a second divided light emission area EA1-2. The second light emission area EA2 provided in the second subpixel P2 may include two divided areas, that is, a first divided light emission area EA2-1 and a second divided light emission area EA2-2. The third light emission area EA3 provided in the third subpixel P3 may include two divided areas, that is, a first divided light emission area EA3-1 and a second divided light emission area EA3-2. The fourth light emission area EA4 provided in the fourth subpixel P4 may include two divided areas, that is, a first divided light emission area EA4-1 and a second divided light emission area EA4-2.

Hereinafter, for convenience of description, the description will be given based on that a first subpixel P1 is a green subpixel emitting green light, a second subpixel P2 is a red subpixel emitting red light, a third subpixel P3 is a blue subpixel emitting blue light, and a fourth subpixel P4 is a white subpixel emitting white light.

The first subpixel P1 and the second subpixel P2 may be provided to overlap at least a part of the first signal line SL1 and alternately disposed along the first signal line SL1.

The third subpixel P3 and the fourth subpixel P4 may be provided to overlap at least a part of the second signal line SL2 and alternately disposed along the second signal line SL2.

The third subpixel P3 and the fourth subpixel P4 may be provided in the area where the first signal line SL1 and the second signal line SL2 cross or overlap each other, as shown in FIG. 3, but are not limited thereto.

In another embodiment, the first subpixel P1 and the second subpixel P2 may be provided in the area where the first signal line SL1 and the second signal line SL2 cross or overlap each other. In this case, the third subpixel P3 and the fourth subpixel P4 may be disposed to be spaced apart from each other with the first subpixel P1 and the second subpixel P2 interposed therebetween in the area where the first signal line SL1 and the second signal line SL2 cross or overlap each other.

A circuit element including a capacitor, a thin film transistor, etc., and a light emitting diode may be provided in each of the first subpixel P1, the second subpixel P2, the third subpixel P3 and the fourth subpixel P4. The thin film transistor may include a switching transistor, a sensing transistor, and a driving transistor TR.

The switching transistor is switched in accordance with scan signals supplied to the scan lines to supply data voltages supplied from the data lines to the driving transistor TR.

The sensing transistor serves to sense a threshold voltage deviation of the driving transistor TR, which causes deterioration of picture quality.

The driving transistor TR is switched in accordance with a data voltage supplied from a switching thin film transistor to generate a data current from a power source supplied from the pixel power line, thereby serving to supply the generated data current to an anode electrode 120 of a subpixel. The driving transistor TR includes an active layer ACT, a gate electrode GE, a source electrode SE and a drain electrode DE.

The capacitor Cst serves to maintain the data voltage supplied to the driving transistor TR for one frame. The capacitor Cst may include two capacitor electrodes, but is not limited thereto. In one embodiment, the capacitor Cst may include three capacitor electrodes.

In detail, the active layer ACT may be provided over a first substrate 111. The active layer ACT may be formed of a silicon based semiconductor material or an oxide based semiconductor material.

A light shielding layer LS for shielding external light entering the active layer ACT and a first capacitor electrode CE1 may be provided between the active layer ACT and the first substrate 111 as shown in FIGS. 5 and 6. The light shielding layer LS and the first capacitor electrode CE1 may be integrally formed, and may be made of a conductive material. For example, the light shielding layer LS may be formed of a single layer or a multi-layer made of any one of Mo, Al, Cr, Au, Ti, Ni, Nd and Cu, or their alloy. In this case, a buffer film BF may be provided between the light shielding layer LS and the active layer ACT.

A gate insulating film GI may be provided over the active layer ACT. The gate insulating layer GI may be formed as an inorganic film, for example, a silicon oxide (SiOx) film, a silicon nitride (SiNx) film, or a multi-layered film of SiOx and SiNx.

A gate electrode GE and a second capacitor electrode CE2 may be provided over the gate insulating film GI. The gate electrode GE and the second capacitor electrode CE2 may be formed of a single layer or a multi-layer made of any one of Mo, Al, Cr, Au, Ti, Ni, Nd and Cu or their alloy.

An inter-layer insulating layer ILD may be provided over the gate electrode GE and the second capacitor electrode CE2. The inter-layer insulating layer ILD may be formed as an inorganic layer, for example, a silicon oxide (SiOx) layer, a silicon nitride (SiNx) layer, or a multi-layered layer of SiOx and SiNx.

A source electrode SE, a drain electrode DE and the third capacitor electrode CE3 may be provided over the inter-layer insulating layer ILD. One of the source and drain electrodes SE and DE may be connected to the active layer ACT through a contact hole that passes through the gate insulating layer GI and the inter-layer insulating layer ILD.

The source electrode SE, the drain electrode DE and the third capacitor electrode CE3 may be formed of a single layer or a multi-layer made of any one of Mo, Al, Cr, Au, Ti, Ni, Nd and Cu or their alloy.

A passivation layer PAS may be provided over the source electrode SE, the drain electrode DE and the third capacitor electrode CE3 for protecting the driving transistor TR. A planarization layer PLN may be provided over the passivation layer PAS to planarize a step difference caused by the driving transistor TR. The planarization layer PLN may be formed of an organic layer, for example, acryl resin, epoxy resin, phenolic resin, polyamide resin, polyimide resin, etc.

Light emitting diodes, which are comprised of the anode electrode 120, an organic light emitting layer 130, and a cathode electrode 140, and a bank 125 are provided over the planarization layer PLN.

An anode electrode 120 may be provided over a planarization layer PLN and connected with the driving transistor TR. In detail, the anode electrode 120 may be connected to the source electrode SE or the drain electrode DE of the driving transistor TR through a contact hole, the anode electrode 120 may electrically be connected with the driving transistor TR.

The anode electrode 120 may be provided for each of the subpixels P1, P2, P3 and P4. One anode electrode 120 may be provided in the first subpixel P1, another anode electrode 120 may be provided in the second subpixel P2, the other anode electrode 120 may be provide in the third subpixel P3, and the other anode electrode 120 may be provided in the fourth subpixel P4. The anode electrode 120 is not provided in the transmissive area TA.

The anode electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti).

A plurality of anode electrodes 120 may be provided in each of the plurality of subpixels P1, P2, P3 and P4. For example, the anode electrode 120 provided in each of the plurality of subpixels P1, P2, P3 and P4 may include a first anode electrode 121, a second anode electrode 122 and a first connection electrode ACE.

The first anode electrode 121 may be disposed in the first divided light emission areas EA1-1, EA2-1, EA3-1 and EA4-1, and the second anode electrode 122 may be disposed in the second divided light emission areas EA1-2, EA2-2, EA3-2 and EA4-2. The first anode electrode 121 and the second anode electrode 122 may be spaced apart from each other in the same layer.

The first connection electrode ACE may connect the first anode electrode 121 with the second anode electrode 122. In detail, the first connection electrode ACE may include a first anode connection portion ACE1, a second anode connection portion ACE2, and a third anode connection portion ACE3, as shown in FIG. 4.

The first anode connection portion ACE1 may be extended from the first anode electrode 121 toward the transmissive area TA as much as a predetermined length. The second anode connection portion ACE2 may be extended from the second anode electrode 122 toward the transmissive area TA as much as a predetermined length. At this time, the second anode connection portion ACE2 may be disposed at a first side of the first anode connection portion ACE1 to adjoin the first anode connection portion ACE1. The third anode connection portion ACE3 may connect one end of the first anode connection portion ACE1 with one end of the second anode connection portion ACE2. Therefore, the first anode electrode 121 may electrically be connected with the second anode electrode 122 through the first connection electrode ACE.

The first anode connection portion ACE1, the second anode connection portion ACE2, and the third anode connection portion ACE3 may be formed in the same layer as the first anode electrode 121 and the second anode electrode 122 in a single body. The area where the first anode connection portion ACE1, the second anode connection portion ACE2, and the third anode connection portion ACE3 are formed may be a non-transmissive area NTA. The transmissive area TA may be provided between the first anode connection portion ACE1 and the second anode connection portion ACE2.

The anode electrode 120 may electrically be connected to the driving transistor TR through a second connection electrode TCE. In detail, the second connection electrode TCE may include a first transistor connection portion TCE1 and a second transistor connection portion TCE2.

The first transistor connection portion TCE1 may be disposed at a second side of the first anode connection portion ACE1 to adjoin the first anode connection portion ACE1. The first transistor connection portion TCE1 may be extended from a light-shielding layer LS in a direction of the transmissive area TA as much as a predetermined length. At this time, the light-shielding layer LS may electrically be connected with a source electrode SE or a drain electrode DE of the driving transistor TR through a first contact hole CH1 as shown in FIG. 5. Therefore, the first transistor connection portion TCE1 may also be electrically connected with the source electrode SE or the drain electrode DE of the driving transistor TR.

The second transistor connection portion TCE2 may be bent from the first transistor connection portion TCE1 toward the first connection electrode ACE and extended in a direction of the first connection electrode ACE as much as a predetermined length. At this time, at least a portion of the second transistor connection portion TCE2 may overlap the third anode connection portion ACE3. The second transistor connection portion TCE2 may electrically be connected with the third anode connection portion ACE3 in the area overlapped with the third anode connection portion ACE3 through a contact hole.

In order to connect the second transistor connection portion TCE2 with the third anode connection portion ACE3, an intermediate connection electrode ICE may further be provided between the second transistor connection portion TCE2 and the third anode connection portion ACE3 as shown in FIG. 5. In this case, the intermediate connection electrode ICE may electrically be connected with the second transistor connection portion TCE2 through a second contact hole CH2, and may electrically be connected with the third anode connection portion ACE3 through a third contact hole CH3.

Although FIG. 6 shows that the second transistor connection portion TCE2 is connected with the third anode connection portion ACE3 through the intermediate connection electrode ICE, but the present disclosure is not limited thereto. In another embodiment, the second transistor connection portion TCE2 may directly be connected with the third anode connection portion ACE3.

In the transparent display panel 110 according to one embodiment of the present disclosure, the first transistor connection portion TCE1 is connected with the source electrode SE or the drain electrode DE of the driving transistor TR, and the second transistor connection portion TCE2 extended from the first transistor connection portion TCE1 is electrically connected to the third anode connection portion ACE3. As a result, the anode electrode 120 may electrically be connected with the source electrode SE or the drain electrode DE of the driving transistor TR through the first connection electrode ACE and the second connection electrode TCE.

The first transistor connection portion TCE1 and the second transistor connection portion TCE2 may be formed in the same layer as the light-shielding layer LS in a single body. Therefore, the area in which the first transistor connection portion TCE1 and the second transistor connection portion TCE2 are formed may be the non-transmissive area NTA. The transmissive area TA may be provided between the first transistor connection portion TCE1 and the first anode connection portion ACE1.

When the transparent display panel 110 according to one embodiment of the present disclosure operates in error by the driving transistor TR, the transparent display panel 110 may be repaired by laser cutting for the second connection electrode TCE along a first laser cutting line LC1.

In addition, when any one of the first anode electrode 121 and the second anode electrode 122 operates in error due to particles that may occur during a process, the transparent display panel 110 may be repaired by laser cutting for at least one of the first anode connection portion ACE1 or the second anode connection portion ACE2 of the first connection electrode ACE.

For example, when short occurs between the anode electrode 120 and the cathode electrode 140 due to particles in the area in which the first anode electrode 121 is provided, the transparent display panel 110 according to one embodiment of the present disclosure may be repaired by laser cutting for the first anode connection portion ACE1 along a second laser cutting line LC2.

For another example, when short occurs between the anode electrode 120 and the cathode electrode 140 due to particles in the area in which the second anode electrode 122 is provided, the transparent display panel 110 according to one embodiment of the present disclosure may be repaired by laser cutting for the second anode connection portion ACE2 along a third laser cutting line LC3.

In the transparent display panel 110 according to one embodiment of the present disclosure, a corresponding anode electrode of the plurality of anode electrodes 121 and 122 may be subjected to short circuit through laser cutting even through a dark spot occurs due to particles, whereby a light loss rate caused by occurrence of the dark spot may be reduced.

The transparent display panel 110 according to one embodiment of the present disclosure is characterized in that the second connection electrode TCE is formed in the same layer as the light-shielding layer LS. In the transparent display panel 110 according to one embodiment of the present disclosure, when the second connection electrode TCE is formed in the same layer as the gate electrode GE or the source electrode SE of the driving transistor TR, a spaced distance in horizontal direction between the first connection electrode ACE and the second connection electrode TCE is increased, whereby interference during laser cutting may be reduced or minimized.

In addition, the transparent display panel 110 according to one embodiment of the present disclosure is characterized in that the second connection electrode TCE is disposed outside the first connection electrode ACE.

As described above, the area provided with the first connection electrode ACE and the second connection electrode TCE becomes the non-transmissive area NTA. Therefore, as the area where the first connection electrode ACE and the second connection electrode TCE are formed is increased, the transmissive area TA is reduced, and light transmittance may be reduced. In order to prevent light transmittance from being reduced, it is preferable to minimize or reduce the area where the first connection electrode ACE and the second connection electrode TCE are formed.

The first connection electrode ACE may be formed of the same material as that of the first anode electrode 121 and the second anode electrode 122 in the same layer as the first anode electrode 121 and the second anode electrode 122. That is, the first connection electrode ACE may be formed of a metal material having high reflectivity, such as a deposited structure (Ti/Al/Ti) of Al and Ti, a deposited structure (ITO/Al/ITO) of Al and ITO, Ag alloy, and a deposited structure (ITO/Ag alloy/ITO) of Ag alloy and ITO.

The second connection electrode TCE may be formed of the same material as that of the light-shielding layer LS in the same layer as the light-shielding layer LS. That is, the second connection electrode TCE may be formed of a single layer or a multi-layer made of any one of molybdenum (Mo), aluminum (Al), chromium (Cr), gold (Au), titanium (Ti), nickel (Ni), neodymium (Nd), and copper (Cu), or their alloy.

A minimum line width of the electrode may be different depending on a material. Since the first connection electrode ACE and the second connection electrode TCE are made of their respective materials different from each other, minimum widths of the first connection electrode ACE and the second connection electrode TCE may be different from each other. Generally, the material constituting the anode electrodes 121 and 122 has a minimum line width greater than that of the light-shielding layer LS. That is, a width W1 of the second connection electrode TCE may be smaller or narrower than a width W2 of the first connection electrode ACE.

In this case, it is preferable to minimize or reduce an area for forming the first connection electrode ACE made of the same material as that of the anode electrodes 121 and 122.

In order to minimize or reduce the area for forming the first connection electrode ACE, in the transparent display panel 110 according to one embodiment of the present disclosure, the second connection electrode TCE may be disposed at the outer side of the first connection electrode ACE1, that is, at the outside.

When the second connection electrode TCE is provided inside the first connection electrode ACE, that is, between the first anode connection portion ACE1 and the second anode connection portion ACE2, the second connection electrode TCE may be formed in a straight line. That is, only the first transistor connection portion TCE1 may be provided, and the second transistor connection portion TCE2 extended by being bent from the first transistor connection portion TCE1 may not be provided.

On the other hand, in the first connection electrode ACE, a length of the third anode connection portion ACE3 for connecting the first anode connection portion ACE1 with the second anode connection portion ACE2 has no choice but to be increased. It is required to make sure of a minimum distance between elements so as not to affect the other elements during laser cutting. For this reason, the first anode connection portion ACE1 should be spaced apart from the first transistor connection portion TCE1 of the second connection electrode TCE as much as a minimum distance, and the second anode connection portion ACE2 should also be spaced apart from the first transistor connection portion TCE1 of the second connection electrode TCE as much as a minimum distance. Therefore, since the distance between the first anode connection portion ACE1 and the second anode connection portion ACE2 is increased, the length of the third anode connection portion ACE3 is increased.

Meanwhile, when the second connection electrode TCE is provided outside the first connection electrode ACE, the second connection electrode TCE may be formed to reach the first transistor connection portion TCE1 and the second transistor connection portion TCE2 extended by being bent from the first transistor connection portion TCE1. That is, the area in which the second connection electrode TCE is formed is more increased than the case that the second connection electrode TCE is provided inside the first connection electrode ACE.

However, the first connection electrode ACE may reduce or minimize the length of the third anode connection portion ACE3 connecting the first anode connection portion ACE1 with the second anode connection portion ACE2. Since other elements are not provided between the first anode connection portion ACE1 and the second anode connection portion ACE2, the first anode connection portion ACE1 and the second anode connection portion ACE2 may be spaced apart from each other as much as only a minimum distance. Since the third anode connection portion ACE3 has a minimum length, the area in which the first connection electrode ACE is formed is more reduced than the case that the second connection electrode TCE is provided inside the first connection electrode ACE.

In the transparent display panel 110 according to one embodiment of the present disclosure, the second connection electrode TCE is provided outside the first connection electrode ACE, whereby the area in which the first connection electrode TCE having a relatively large width W2 is formed may be reduced or minimized. As a result, the transparent display panel 110 according to one embodiment of the present disclosure may minimize or reduce the area in which the first connection electrode ACE and the second connection electrode TCE are formed, and may improve light transmittance.

A bank 125 may be provided over a planarization film PLN. In addition, the bank 125 may be provided between the anode electrodes 120. The bank 125 may be formed to cover or at least partially cover edges of each of the anode electrodes 120 and expose a portion of each of the anode electrodes 120. Therefore, the bank 125 may prevent deterioration of light emission efficiency, which is caused by a current concentrated on an end of each of the anode electrodes 120, from occurring.

The bank 125 may define light emission areas EA1-1, EA1-2, EA2-1, EA2-2, EA3-1, EA3-2, EA4-1 and EA4-2 of each of the subpixels P1, P2, P3 and P4. The light emission areas EA1-1, EA1-2, EA2-1, EA2-2, EA3-1, EA3-2, EA4-1 and EA4-2 of each of the subpixels P1, P2, P3 and P4 denote the areas in which the anode electrode 120, the organic light emitting layer 130, and the cathode electrode 140 are sequentially deposited and holes from the anode electrode 120 are combined with electrons from the cathode electrode 140 in the organic light emitting layer 130 to emit light. In this case, since the area in which the bank 125 is formed does not emit light, the area may be the non-light emission area, and the area in which the bank 125 is not formed and the anode electrode 120 is exposed may be the light emission areas EA1-1, EA1-2, EA2-1, EA2-2, EA3-1, EA3-2, EA4-1 and EA4-2.

The bank 125 may be formed of an organic layer, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly formed for the subpixels P1, P2, P3 and P4. For example, the organic light emitting layer 130 may be a white light emitting layer emitting white light.

In another embodiment, the organic light emitting layer 130 may include light emitting layers formed per subpixels P1, P2, P3 and P4. For example, a green light emitting layer emitting green light may be formed in the first subpixel P1, a red light emitting layer emitting red light may be formed in the second subpixel P2, a blue light emitting layer emitting blue light may be formed in the third subpixel P3, and a white light emitting layer emitting white light may be formed in the fourth subpixel P4. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. The cathode electrode 140 may be provided only in the non-transmissive area NTA that includes the emission area EA, but may not be provided in the transmissive area TA to improve transmittance.

The cathode electrode 140 may be a common layer commonly formed in the subpixels P1, P2 and P3 to apply the same voltage. The cathode electrode 140 may be formed of a conductive material that may transmit light. For example, the cathode electrode 140 may be formed of a low resistance metal material, for example, Ag, or alloy of Mg and Ag.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. To this end, the encapsulation layer 150 may include at least one inorganic layer and at least one organic layer.

Meanwhile, although not shown in FIG. 5 and FIG. 6, a capping layer may additionally be formed between the cathode electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be formed to be patterned for each of the subpixels P1, P2, P3 and P4. In detail, the color filter CF may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

In the transparent display panel 110 according to one embodiment of the present disclosure, a polarizer is not used, and the color filter CF is formed in the second substrate 112. When the polarizer is attached to the transparent display panel 110, transmittance of the transparent display panel 110 is reduced by the polarizer. When the polarizer is not attached to the transparent display panel 110, a problem occurs in that externally incident light is reflected in the electrodes.

The transparent display panel 110 according to one embodiment of the present disclosure may prevent transmittance from being reduced as a polarizer is not attached thereto. Also, in the transparent display panel 110 according to one embodiment of the present disclosure, the color filter CF may be formed in the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided among color filters CF1, CF2 and CF3. The black matrix BM may be provided among the subpixels P1, P2 and P3 to prevent color mixture from occurring among the subpixels P1, P2 and P3 adjacent to one another.

The black matrix BM may include a material that absorbs light, for example, a black dye that fully absorbs light of a visible light wavelength range.

Figure 7:
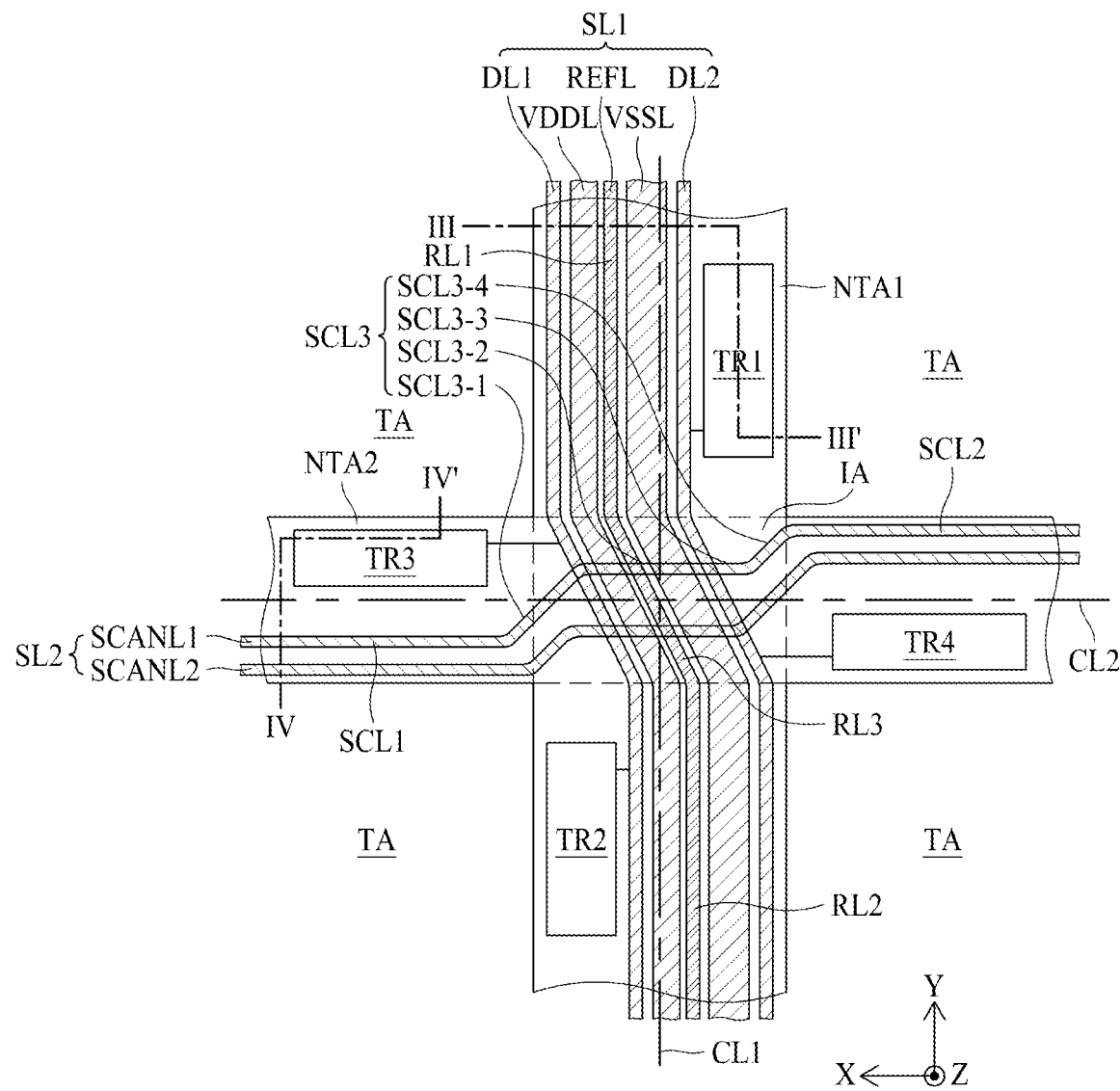
FIG. 7 is a view illustrating an example that a plurality of signal lines and a plurality of driving transistors are disposed.
Figure 8:
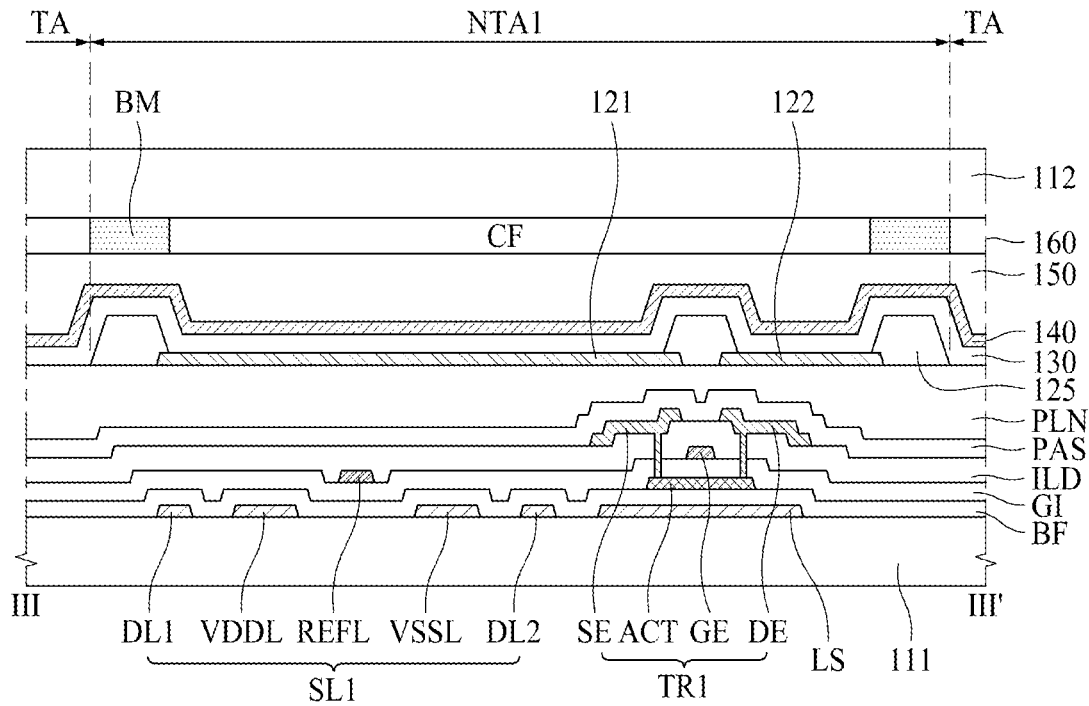
FIG. 8 is a cross-sectional view taken along line III-III' of FIG. 7.
Figure 9:
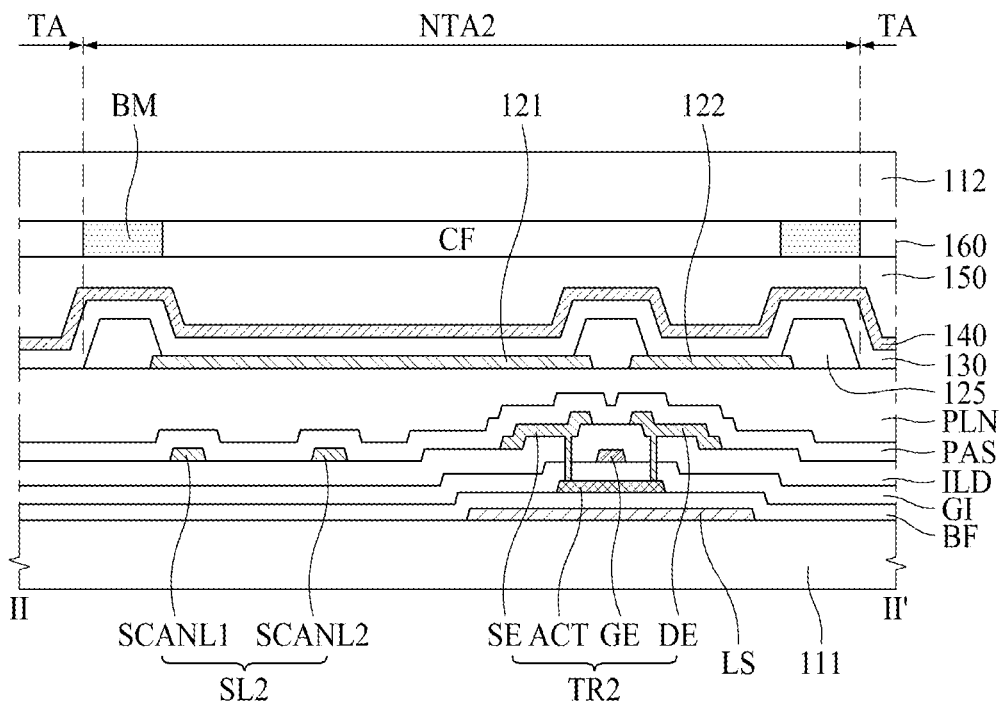
FIG. 9 is a cross-sectional view taken along line IV-IV' of FIG. 7.
Figure 10:
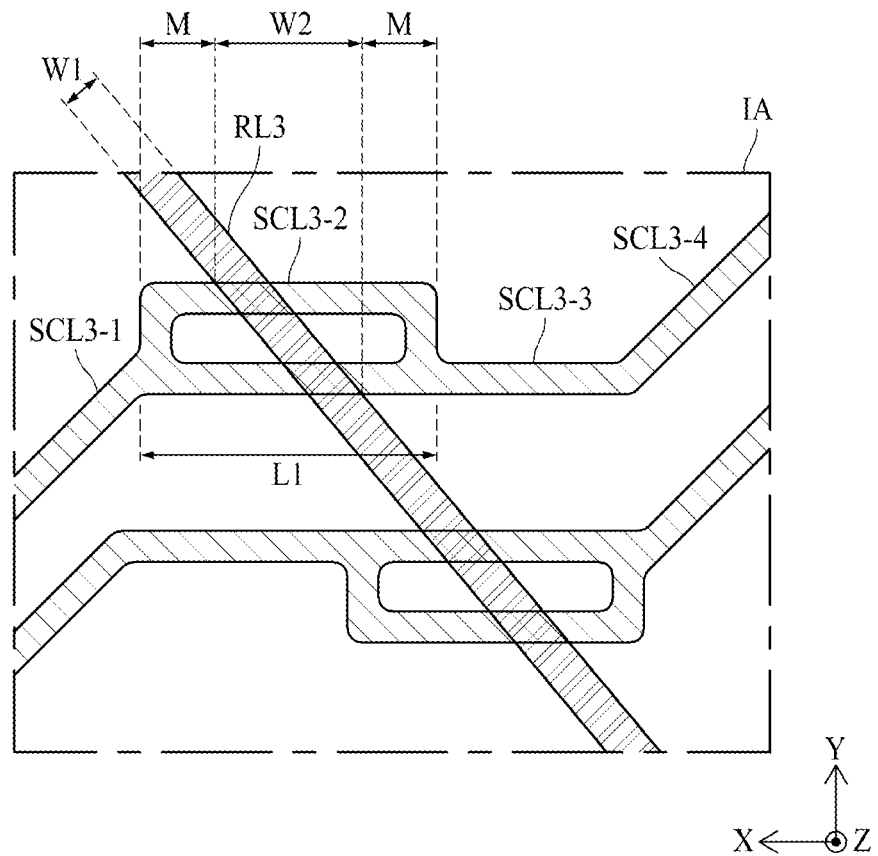
FIG. 10 is a view illustrating an example that a reference line and a scan line are disposed in an intersection area.

FIG. 7 is a view illustrating an example that a plurality of signal lines and a plurality of driving transistors are disposed, FIG. 8 is a cross-sectional view taken along line of FIG. 7, and FIG. 9 is a cross-sectional view taken along line IV-IV' of FIG. 7. FIG. 10 is a view illustrating an example that a reference line and a scan line are disposed in an intersection or overlapping area.

Hereinafter, an example in which the first signal line SL1, the second signal line SL2, and the driving transistor TR are disposed will be described in detail with reference to FIGS. 7 to 9.

As described above, the display area DA includes a transmissive area TA and a non-transmissive area NTA. The non-transmissive area NTA includes a first non-transmissive area NTA1 extended in a first direction (e.g., Y-axis direction) between adjacent transmissive areas TA, and a second non-transmissive area NTA2 extended in a second direction (e.g., X-axis direction) between adjacent transmissive areas TA.

The first signal line SL1 and driving transistors TR1 and TR2 of the subpixels P1 and P2 disposed to overlap the first signal line SL1 may be disposed in the first non-transmissive area NTA1. For example, the first and second subpixels P1 and P2 may be provided to overlap at least a part of the first signal line SL1, and may alternately be disposed along the first signal line SL1. The first signal line SL1, the first driving transistor TR1 of the first subpixel P1, and the second driving transistor TR2 of the second subpixel P2 may be disposed in the first non-transmissive area NTA1.

The first signal line SL1 may be provided in the first non-transmissive area NTA1 and extended in the first direction (e.g., Y-axis direction). The first signal line SL1 may include a plurality of signal lines, and may include, for example, a first data line DL1, a reference line REFL, and a second data line DL2.

In detail, the reference line REFL may be provided in the first non-transmissive area NTA1 and extended in the first direction (e.g., Y-axis direction). The reference line REFL may supply a reference voltage (or an initialization voltage, a sensing voltage) to the driving transistor TR of each of the subpixels P1, P2 P3, and P4 provided in the display area DA.

The first data line DL1 may be provided in the first non-transmissive area NTA1, disposed at a first side of the reference line REFL and extended in the first direction (e.g., Y-axis direction). The first data line DL1 may supply a data voltage to at least a portion of the subpixels P1, P2, P3 and P4 provided in the display area DA.

For example, the first data line DL1 may supply a first data voltage to the second driving transistor TR2 of the second subpixel P2 and the third driving transistor TR3 of the third subpixel P3, which are disposed at the first side of the reference line REFL.

The second data line DL2 may be provided in the first non-transmissive area NTA1, disposed at a second side of the reference line REFL and extended in the first direction (e.g., Y-axis direction). At this time, the second side of the reference line REFL may be a side facing the first side. For example, when the first side is a left side of the reference line REFL, the second side may be a right side of the reference line REFL. The second data line DL2 may supply the data voltage to the other subpixels except the subpixel connected with the first data line DL1, among the subpixels P1, P2, P3 and P4 provided in the display area DA.

For example, the second data line DL2 may supply a second data voltage to the first driving transistor TR1 of the first subpixel P1 and the fourth driving transistor TR4 of the fourth subpixel P4, which are disposed at the second side of the reference line REFL.

The first signal line SL1 may further include a first power line and a second power line.

The first power line may be provided in the first non-transmissive area NTA1, disposed between the reference line REFL and the first data line DL1 and extended in the first direction (e.g., Y-axis direction).

The second power line may be disposed in the first non-transmissive area NTA1, disposed between the reference line REFL and the second data line DL2 and extended in the first direction (e.g., Y-axis direction).

In one embodiment, one of the first power line and the second power line may be a pixel power line VDDL for supplying a first power source to the anode electrode 120 of each of the subpixels P1, P2, P3 and P4. In one embodiment, one of the first power line and the second power line may be a common power line VSSL for supplying a second power source to the cathode electrode 140 of each of the subpixels P1, P2, P3 and P4.

The transparent display panel 110 according to one embodiment of the present disclosure is characterized in that the reference line REFL is not disposed to be adjacent to the first and second data lines DL1 and DL2.

A certain voltage may be applied to the reference line REFL, whereas a data voltage may be applied to the data lines DL1 and DL2 in the form of a pulse. When the reference line REFL is disposed to be adjacent to the data lines DL1 and DL2, a crosstalk phenomenon caused by a capacitive coupling may occur between the reference line REFL and the data lines DL1 and DL2 when a voltage variation occurs in the data lines DL1 and DL2. In this case, the voltage of the reference line REFL may vary, and furthermore, luminance of the subpixels P1, P2, P3 and P4 may be changed. As a result, a dark line or a bright line may occur.

The transparent display panel 110 may be provided with a wide transmissive area TA to make sure of light transmittance, and may be provided with a relatively narrow non-transmissive area NTA. Since the plurality of signal lines do not have transmittance, the plurality of signal lines may be disposed in the non-transmissive area NTA. At this time, since a plurality of signal lines are disposed in the non-transmissive area NTA of a narrow area as compared with a general display panel, the spaced distance between the signal lines cannot be reduced. For this reason, parasitic capacitance between the reference line REFL and the data lines DL1 and DL2 is increased in the transparent display panel 110, and the cross talk phenomenon caused by the coupling may occur more seriously.

In the transparent display panel 110 according to one embodiment of the present disclosure, in order to minimize or reduce parasitic capacitance between the reference line REFL and the data lines DL1 and DL2 in a limited space, the reference line REFL and the data lines DL1 and DL2 may not be disposed to be adjacent to each other.

In detail, in the transparent display device 110 according to one embodiment of the present disclosure, the pixel power line VDDL or the common power line VSSL may be disposed between the reference line REFL and the first data line DL1, whereby the reference line REFL and the first data line DL1 may not be disposed adjacent to each other. In addition, in the transparent display device 110 according to one embodiment of the present disclosure, the pixel power line VDDL or the common power line VSSL may be disposed between the reference line REFL and the second data line DL2, whereby the reference line REFL and the second data line DL2 may not be disposed to be adjacent to each other. Since a certain power voltage not a pulse type is applied to the pixel power line VDDL or the common power line VSSL, the reference line REFL may little be affected by the pixel power line VDDL or the common power line.

That is, in the transparent display panel 110 according to one embodiment of the present disclosure, different signal lines are disposed between the reference line REFL and the data lines DL1 and DL2, whereby the spaced distance between the reference line REFL and the data lines DL1 and DL2 may be increased. Therefore, the transparent display panel 110 according to one embodiment of the present disclosure may reduce parasitic capacitance between the reference line REFL and the data lines DL1 and DL2.

In the transparent display panel 110 according to one embodiment of the present disclosure, the reference line REFL and the data lines DL1 and DL2 may be provided in their respective layers different from each other. In detail, the reference line REFL may be provided in a first layer, and the data lines DL1 and DL2 may be provided in a second layer different from the first layer.

In one embodiment, the reference line REFL may be provided in the same layer as one of the elements constituting the driving transistor TR. In detail, the reference line REFL may be provided in the same layer as any one of the active layer ACT, the gate electrode GE, the source electrode SE and the drain electrode DE of the driving transistor TR. For example, the reference line REFL may be provided in the same layer as the gate electrode GE as shown in FIG. 8.

In one embodiment, the data lines DL1 and DL2 may be provided between the driving transistor TR and the substrate 111. For example, the data lines DL1 and DL2 may be formed in the same layer as the light-shielding layer LS as shown in FIG. 5.

In the transparent display panel 110 according to one embodiment of the present disclosure, the reference line REFL and the data lines DL1 and DL2 are provided in their respective layers different from each other, whereby the spaced distance in vertical direction between the reference line REFL and the data lines DL1 and DL2 in a limited space may be maximized. Therefore, the transparent display panel 110 according to one embodiment of the present disclosure may minimize or reduce parasitic capacitance between the reference line REFL and the data lines DL1 and DL2.

Meanwhile, the first driving transistor TR1 and the second driving transistor TR2 may be disposed in a zigzag pattern without being disposed on a straight line. In more detail, as shown in FIG. 7, the first driving transistor TR1 may be disposed at one side of a first center line CL1 parallel with the first direction (e.g., Y-axis direction) in the first non-transmissive area NTA1, and the second driving transistor TR2 may be disposed at the other side of the first center line CL1.

That is, the first driving transistor TR1 may be disposed at the second side of the reference line REFL, and may be provided between the second data line DL2 and the transmissive area TA. The second driving transistor TR2 may be disposed at the first side of the reference line REFL, and may be provided between the first data line DL1 and the transmissive area TA.

The transparent display panel 110 according to one embodiment of the present disclosure is characterized in that the first driving transistor TR1 and the second driving transistor TR2 are disposed in a zigzag pattern.

For example, it is assumed that the first driving transistor TR1 and the second driving transistor TR2 are disposed on a straight line at the first side of the reference line REFL.

The first driving transistor TR1 may be connected to the first data line DL1, and the second driving transistor TR2 may be connected to the second data line DL2. At this time, a connection line for connecting the second driving transistor TR2 with the second data line DL2 should cross the first data line DL1, the pixel power line VDDL, the reference line REFL, and the common power line VSSL. Therefore, the connection line for connecting the second driving transistor TR2 with the second data line DL2 may have a longer length, and loss may occur in the data voltage due to resistance.

In addition, since a connection line for connecting the first driving transistor TR1 with the first data line DL1 has a length different from that of the connection line for connecting the second driving transistor TR2 and the second data line DL2, deviation may occur in the data voltage.

In the transparent display panel 110 according to one embodiment of the present disclosure, the first driving transistor TR1 and the second driving transistor TR2 may be disposed in a zigzag pattern so that the connection line for connecting the first driving transistor TR1 with the first signal line SL1 may have a length the same as or similar to that of the connection line for connecting the second driving transistor TR2 with the second signal line SL2.

Therefore, the transparent display panel 110 according to one embodiment of the present disclosure may prevent deviation from occurring in the signal voltage applied to each of the first driving transistor TR1 and the second driving transistor TR2.

In addition, the transparent display panel 110 according to one embodiment of the present disclosure may reduce or minimize the lengths of the connection lines for connecting the first signal line SL1 with the first and second driving transistors TR1 and TR2. The transparent display panel 110 according to one embodiment of the present disclosure may prevent loss from occurring the signal voltage such as the data voltage.

The second signal line SL2 and the driving transistors TR3 and TR4 of the subpixels P3 and P4 disposed to overlap the second signal line SL2 may be disposed in the second non-transmissive area NTA2. For example, the third and fourth subpixels P3 and P4 may be provided to overlap at least a part of the second signal line SL2, and may alternately be disposed along the second signal line SL2. The second signal line SL2, the third driving transistor TR3 of the third subpixel P3, and the fourth driving transistor TR4 of the fourth subpixel P4 may be disposed in the second non-transmissive area NTA2.

The second signal line SL2 may be provided in the second non-transmissive area NTA2 and then extended in the second direction (e.g., X-axis direction). The second signal line SL2 may include a plurality of signal lines, and may include, for example, at least one scan line SCANL1 and SCANL2.

Hereinafter, the description is based on that two scan lines SCANL1 and SCANL2 are provided in the second non-transmissive area NTA2, but the present disclosure is not limited thereto. Only one scan line may be provided in the second non-transmissive area NTA2.

In detail, the first scan line SCANL1 may be provided in the second non-transmissive area NTA2 and then extended in the second direction (e.g., X-axis direction). The first scan line SCANL1 may supply a scan signal to at least a portion of the subpixels P1, P2, P3 and P4 provided in the display area DA.

For example, the first scan line SCANL1 may supply a first scan signal to the first driving transistor TR1 of the first subpixel P1 and the third driving transistor TR3 of the third subpixel P3.

The second scan line SCANL2 may be provided in the second non-transmissive area NTA2 and then extended in the second direction (e.g., X-axis direction). The second scan line SCANL2 may supply a scan signal to the other subpixels except the subpixel connected with the first scan line SCANL1 among the subpixels P1, P2, P3 and P4 provided in the display area DA.

For example, the second scan line SCANL2 may supply the second scan signal to the second driving transistor TR2 of the second subpixel P2 and the fourth driving transistor TR4 of the fourth subpixel P4.

The first and second scan lines SCANL1 and SCANL2 may be formed in a layer different from the first signal line SL1. In detail, the first and second scan lines SCANL1 and SCANL2 may be formed in a layer different from the first data line DL1, the reference line REFL and the second data line DL2.

In one embodiment, the first and second scan lines SCANL1 and SCANL2 may be provided in the same layer as one of the elements constituting the driving transistor TR. In detail, the first and second scan lines SCANL1 and SCANL2 may be provided in the same layer as any one of the active layer ACT, the gate electrode GE, the source electrode SE and the drain electrode DE of the driving transistor TR. For example, as shown in FIG. 9, the first and second scan lines SCANL1 and SCANL2 may be provided in the same layer as the source electrode SE and the drain electrode DE, as shown in FIG. 9.

The first signal line SL1 and the second signal line SL2 may cross or overlap each other in the intersection or overlapping area IA where the first non-transmissive area NTA1 and the second non-transmissive area NTA2 cross or overlap each other. The first signal line SL1 and the second signal line SL2 may be subjected to short in the intersection or overlapping area IA.

Particularly, it is likely that the signal line formed in the same layer as the gate electrode GE and the signal line formed in the same layer as the source electrode SE and the drain electrode DE are subjected to short due to particles.

In accordance with one embodiment, when the reference line REFL is formed in the same layer as the gate electrode GE of the driving transistor TR and the scan lines SCANL1 and SCANL2 are formed in the same layer as the source electrode SE and the drain electrode DE of the driving transistor TR, the reference line REFL and the scan lines SCANL1 and SCANL2 may be subjected to short due to particles.

In the transparent display panel 110 according to one embodiment of the present disclosure, when short occurs between the reference line REFL and the scan lines SCANL1 and SCANL2, a repair structure is applied to the scan lines SCANL1 and SCANL2.

Hereinafter, an example in which the reference line REFL and the scan lines SCANL1 and SCANL2 are disposed in the intersection or overlapping area IA will be described with reference to FIGS. 7 and 10.

The reference line REFL may include a first line portion RL1, a second line portion RL2, and a bent portion RL3.

The first line portion RL1 may be disposed at the first side of the first center line CL1 parallel with the first direction (e.g., Y-axis direction) in the first non-transmissive area NTA1, and the second line portion RL2 may be disposed at a second side of the first center line CL1.

The bent portion RL3 may be bent in the intersection or overlapping area IA where the first non-transmissive area NTA1 and the second non-transmissive area NTA2 cross or overlap each other, thereby connecting the first line portion RL1 with the second line portion RL2. As shown in FIGS. 7 and 10, the bent portion RL3 may be formed to be inclined with respect to a second center line CL2 parallel with the second direction (e.g., X-axis direction) in the second non-transmissive area NTA2.

Each of the scan lines SCANL1 and SCANL2 may include a first line portion SCL1, a second line portion SCL2, and a connection line portion SCL3.

The first line portion SCL1 may be disposed at the first side of the reference line REFL, and the second line portion SCL2 may be disposed at the second side of the reference line REFL.

The connection line portion SCL3 may be provided in the intersection or overlapping area IA where the first non-transmissive area NTA1 and the second non-transmissive area NTA2 cross or overlap each other, and may connect the first line portion SCL1 with the second line portion SCL2. As shown in FIGS. 7 and 10, the connection line portion SCL3 may include a plurality of divergence lines SCL3-2.

In detail, the connection line portion SCL3 may dispose the plurality of divergence lines SCL3-2 in an area crossing the bent portion RL3 of the reference line REFL. Each of the plurality of divergence lines SCL3-2 may have a first length L1 and at least a portion thereof may overlap the bent portion RL3 of the reference line REFL. The plurality of divergence lines SCL3-2 may be spaced apart from each other.

Although FIG. 10 shows that the plurality of divergence lines SCL3-2 are two, the present disclosure is not limited thereto. The plurality of divergence lines SCL3-2 may be formed to be more than two.

The connection line portion SCL3 may further include a plurality of sub connection line portions SCL3-1, SCL3-3 and SCL3-4 for connecting the first line portion SCL1 with the plurality of divergence lines SCL3-2, or connecting the second line portion SCL2 with the plurality of divergence lines SCL3-2. As shown in FIGS. 7 and 10, the plurality of sub connection lines SCL3-1, SCL3-3 and SCL3-4 may be formed to be inclined or parallel with respect to the second center line CL2.

The scan lines SCANL1 and SCANL2 according to one embodiment of the present disclosure are formed of a plurality of divergence lines SCL3-2 in the area crossing the bent portions RL3 of the reference line REFL. In the transparent display panel 110 according to one embodiment of the present disclosure, when short occurs between any one of the plurality of divergence lines SCL3-2 and the bent portion RL3 of the reference line REFL, the corresponding divergence line SCL3-2 may be cut by a laser to be separated from the plurality of sub connection lines SCL3-1, SCL3-3, and SCL3-4 and then repaired.

In FIGS. 7 and 10, the bent portion RL3 of the reference line REFL is inclined with respect to the second center line CL2, but is not limited thereto. The bent portion RL3 of the reference line REFL may be provided to be parallel with the second center line CL2.

Figure 11:
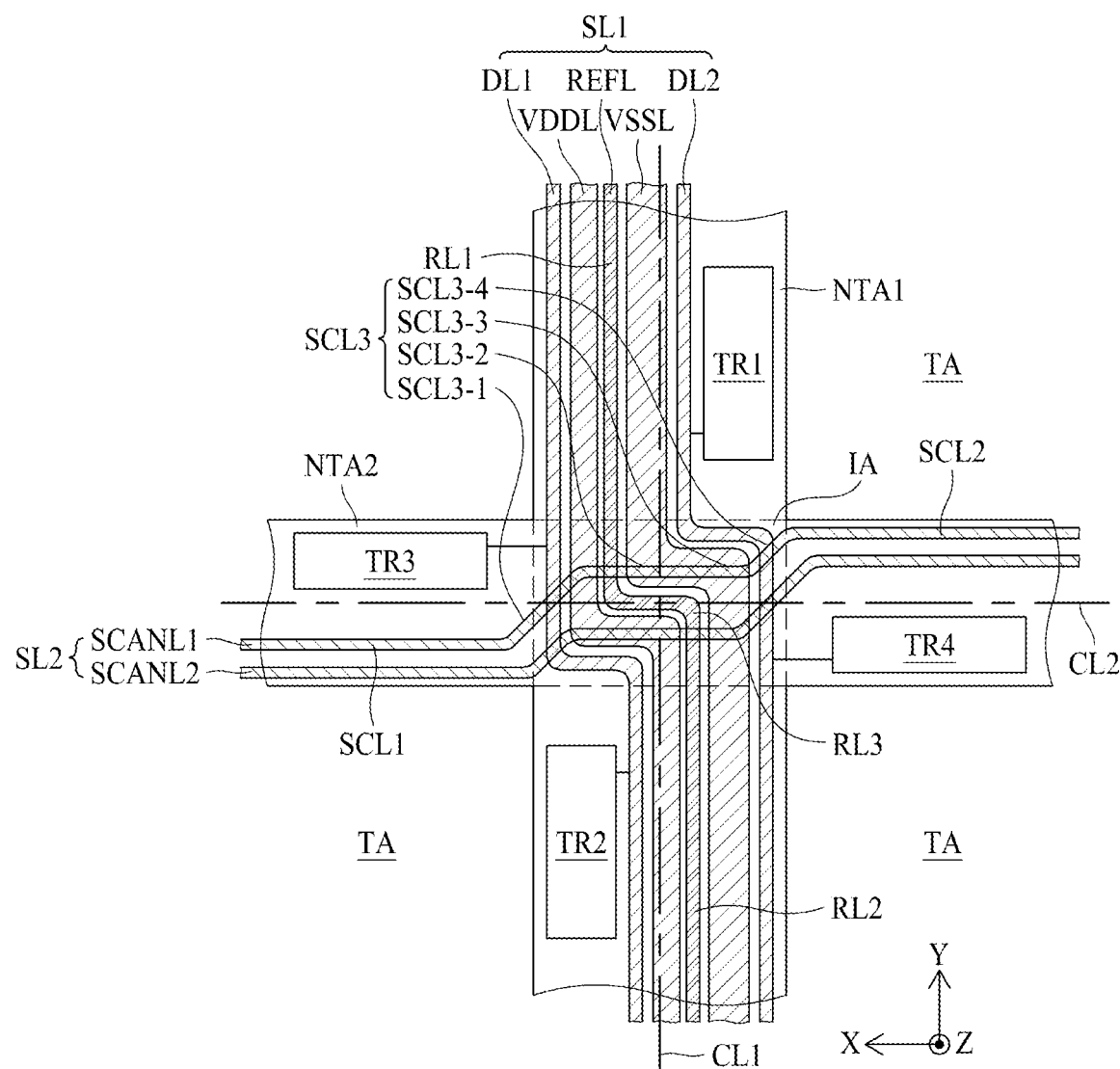
FIG. 11 is a view illustrating another example that a plurality of signal lines and a plurality of driving transistors are disposed.
Figure 12:
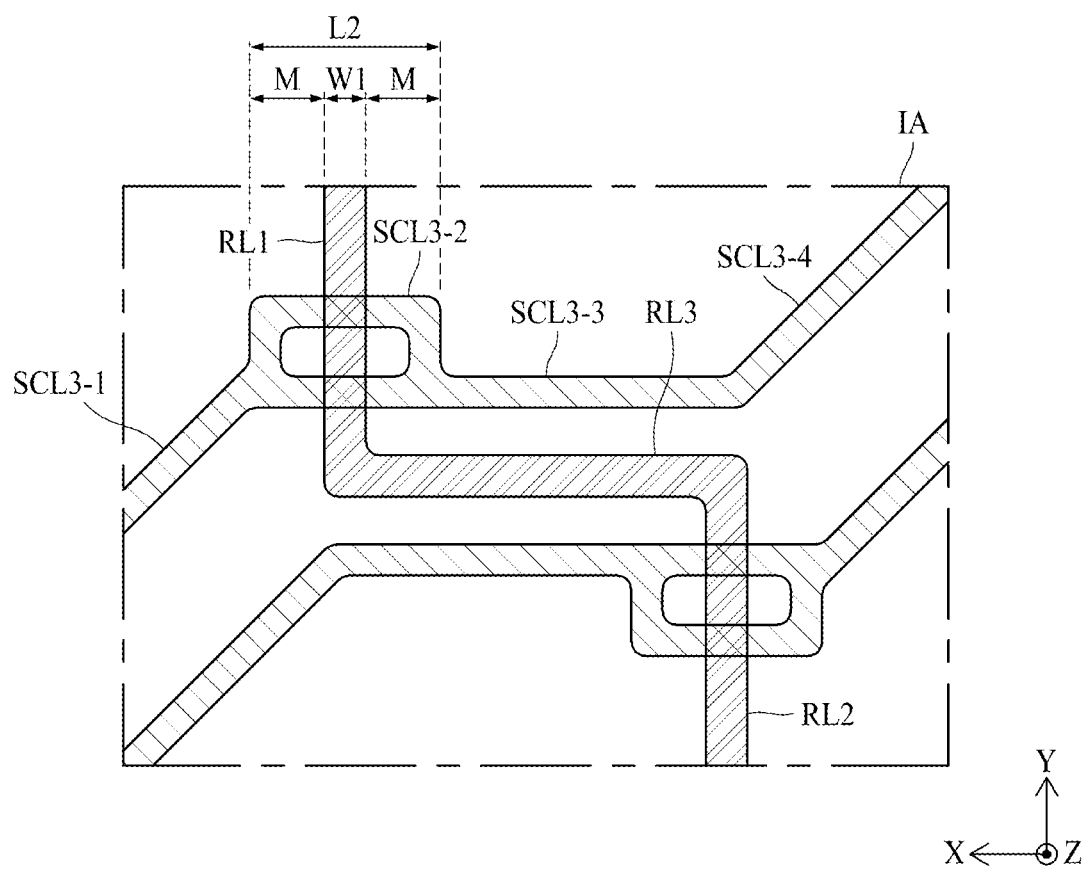
FIG. 12 is a view illustrating another example that a reference line and a scan line are disposed in an intersection area.

FIG. 11 is a view illustrating another example that a plurality of signal lines and a plurality of driving transistors are disposed, and FIG. 12 is a view illustrating another example that a reference line and a scan line are disposed in an intersection or overlapping area.

Hereinafter, the repeated description will be omitted, and the reference line REFL and the scan lines SCANL1 and SCANL2 will mainly be described.

Referring to FIGS. 11 and 12, the reference line REFL may include a first line portion RL1, a second line portion RL2, and a bent portion RL3.

The first line portion RL1 may be disposed at the first side of the first center line CL1 parallel with the first direction (e.g., Y-axis direction) in the first non-transmissive area NTA1, and the second line portion RL2 may be disposed at the second side of the first center line CL1.

The bent portion RL3 may be bent from the intersection or overlapping area IA where the first non-transmissive area NTA1 and the second non-transmissive area NTA2 cross or overlap each other, thereby connecting the first line portion RL1 with the second line portion RL2. The bent portion RL3 may connect one end of the first line portion RL1 with one end of the second line portion RL2.

The bent portion RL3 may be formed to be parallel with the second center line CL2, as shown in FIGS. 11 and 12. In this case, the first line portion RL1 and the second line portion RL2 may be extended to the intersection or overlapping area IA. One end of the first line portion RL1 and one end of the second line portion RL2 may be equal to each other in a distance from the second center line CL2.

Each of the scan lines SCANL1 and SCANL2 may include a first line portion SCL1, a second line portion SCL2, and a connection line portion SCL3.

The first line portion SCL1 may be disposed at the first side of the reference line REFL, and the second line portion SCL2 may be disposed at the second side of the reference line REFL.

The connection line portion SCL3 may be provided in the intersection or overlapping area IA where the first non-transmissive area NTA1 and the second non-transmissive area NTA2 cross or overlap each other, and may connect the first line portion SCL1 with the second line portion SCL2.

As shown in FIGS. 11 and 12, the connection line portion SCL3 may include a plurality of divergence lines SCL3-2.

In detail, each of the plurality of divergence lines SCL3-2 may cross or overlap any one of the first line portion RL1 and the second line portion RL2 of the reference line REFL. For example, when the plurality of divergence lines SCL3-2 are two, one divergence line SCL3-2 may have a second length L2, and at least a portion thereof may overlap the first line portion RL1. The other divergence line SCL3-2 may be spaced apart from one divergence line SCL3-2, may have a second length L2, and at least a portion thereof may overlap the second line portion RL2.

In FIG. 12, the plurality of divergence lines SCL3-2 are shown to be two, but are not limited thereto. The plurality of divergence lines SCL3-2 may be formed to be more than two.

The connection line portion SCL3 may further include a plurality of sub connection line portions SCL3-1, SCL3-3 and SCL3-4 for connecting the first line portion SCL1 with the plurality of divergence lines SCL3-2 or connecting the second line portion SCL2 with the plurality of divergence lines SCL3-2. The plurality of sub connection line portions SCL3-1, SCL3-3 and SCL3-4 may be formed to be inclined or parallel with respect to the second center line CL2 as shown in FIGS. 11 and 12.

The scan lines SCANL1 and SCANL2 according to another embodiment of the present disclosure are formed with a plurality of divergence lines SCL3-2 in an area crossing the bent portion RL3 of the reference line REFL. In the transparent display panel 110 according to one embodiment of the present disclosure, when short occurs between any one of the plurality of divergence lines SCL3-2 and the bent portion RL3 of the reference line REFL, the corresponding divergence line SCL3-2 may be cut by a laser to be separated from the sub connection line portions SCL3-1, SCL3-3 and SCL3-4 and then repaired.

Meanwhile, the bent portion RL3 of the reference line REFL according to another embodiment of the present disclosure may be formed to be parallel with the second center line CL2, whereby a length of the divergence lines SCL3-2 of the scan lines SCANL1 and SCANL2 may be reduced or minimized.

In detail, a minimum margin width M from the reference line REFL is required for laser cutting with respect to the divergence line SCL3-2 when short occurs.

One divergence line SCL3-2 of the scan lines SCANL1 and SCANL2 shown in FIG. 10 needs to make sure of a minimum margin width M at one side, for example, left side of the reference line REFL, and the other divergence line SCL3-2 needs to make sure of a minimum margin width M at the other side, for example, right side of the reference line REFL.

Since the bent portion RL3 of the reference line REFL shown in FIG. 10 is inclined with respect to the second center line CL2, a width W2 between the minimum margin width M at the left side and the minimum margin width M at the right side is greater than the width W1 of the reference line REFL.

Meanwhile, the bent portion RL3 of the reference line REFL shown in FIG. 12 is parallel with the second center line CL2, and the divergence lines SCL3-2 of the scan lines SCANL1 and SCANL2 cross or overlap the first line portion RL1 or the second line portion RL2 disposed to be perpendicular to the second center line CL2. In this case, the width between the minimum margin width M at the left side and the minimum margin width M at the right side may be equal to the width W1 of the reference line REFL.

As a result, the length L2 of the divergence lines SCL3-2 of the scan lines SCANL1 and SCANL2 shown in FIG. 12 may be shorter than the length L1 of the divergence lines SCL3-2 of the scan lines SCANL1 and SCANL2 shown in FIG. 10. The scan lines SCANL1 and SCANL2 according to another embodiment of the present disclosure may easily apply a repair structure to a limited space and improve the degree of freedom in design by minimizing the length of the divergence lines SCL3-2.

According to the present disclosure, the following advantageous effects may be obtained.

The present disclosure may reduce a light loss rate caused by occurrence of a dark spot by short-circuiting only a corresponding anode electrode among a plurality of anode electrodes through laser cutting even though the dark spot occurs due to particles.

Also, since the second connection electrode for connection with the driving transistor is formed in the same layer as the light-shielding layer, the spaced distance between the first connection electrode and the second connection electrode may be increased. Therefore, the present disclosure may minimize or reduce interference between elements during laser cutting.

Also, the second connection electrode is provided outside the first connection electrode, whereby the area in which the first connection electrode and the second connection electrode are formed may be reduced or minimized. As a result, the present disclosure may improve light transmittance.

As different signal lines are disposed between the reference line and the data line, the spaced distance between the reference line and the data line may be increased. Therefore, parasitic capacitance between the reference line and the data line may be reduced.

Also, in the present disclosure, the scan line may be formed with the plurality of divergence lines in the area crossing the reference line. Therefore, when short occurs between any one of the plurality of divergence lines and the reference line, the corresponding divergence line may be cut by a laser and then repaired.

Also, in the present disclosure, the bent portion of the reference line may be formed to be parallel with the second center line, whereby the length of the plurality of divergence lines provided in the scan line may be reduced or minimized. Therefore, in the present disclosure, a repair structure of the scan line may easily be applied to a limited space, and the degree of freedom in design may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
   a substrate including a plurality of transmissive areas and a plurality of subpixels disposed between the transmissive areas;
   first and second anode electrodes provided in each of the plurality of subpixels;
   a first connection electrode configured to connect the first anode electrode with the second anode electrode;
   a driving transistor provided in each of the plurality of subpixels; and
   a second connection electrode provided below the driving transistor,
   wherein the second connection electrode is configured to electrically connect the driving transistor with the first connection electrode.

2. The transparent display device of claim 1, further comprising a light-shielding layer provided between the substrate and the driving transistor, wherein the second connection electrode is made of a same material as that of the light-shielding layer in a same layer as the light-shielding layer.

3. The transparent display device of claim 2, wherein the light-shielding layer is electrically connected with the driving transistor through a first contact hole, wherein the second connection electrode is electrically connected with the first connection electrode through a second contact hole.

4. The transparent display device of claim 3, further comprising an intermediate connection electrode provided between the first connection electrode and the second connection electrode,
   wherein the intermediate connection electrode is electrically connected with the second connection electrode through the second contact hole, and
   wherein the intermediate connection electrode is connected with the first connection electrode through a third contact hole.

5. The transparent display device of claim 1, wherein the second connection electrode includes a first transistor connection portion extended from a light-shielding layer disposed between the driving transistor and the substrate toward one of the transmissive areas, and a second transistor connection portion bent from the first transistor connection portion toward the first connection electrode, having at least a portion overlapped with the first connection electrode.

6. The transparent display device of claim 1, further comprising:
a reference line extended from a non-transmissive area provided between the transmissive areas in a first direction;
a first data line disposed at a first side of the reference line;
a second data line disposed at a second side of the reference line;
a first power line provided between the reference line and the first data line; and
a second power line provided between the reference line and the second data line,
wherein the first data line and the second data line are provided in a same layer as the second connection electrode.

7. The transparent display device of claim 6, wherein the reference line is provided in a layer different from the first data line and the second data line.

8. The transparent display device of claim 6, wherein the non-transmissive area includes a first non-transmissive area extended in the first direction between the transmissive areas and a second non-transmissive area extended in a second direction between the transmissive areas, and the reference line includes a bent portion bent in an area where the first non-transmissive area and the second non-transmissive area overlap each other.

9. The transparent display device of claim 8, wherein the bent portion is provided to be parallel with the second non-transmissive area.

10. A transparent display device comprising:
a substrate including a plurality of transmissive areas and a plurality of subpixels disposed between the transmissive areas;
first and second anode electrodes provided in each of the plurality of subpixels;
a first connection electrode connecting the first anode electrode with the second anode electrode;
a driving transistor provided in each of the plurality of subpixels; and
a second connection electrode disposed outside the first connection electrode, electrically connecting the driving transistor with the first connection electrode.

11. The transparent display device of claim 10, wherein the first connection electrode includes a first anode connection portion extended from the first anode electrode toward one of the transmissive areas, a second anode connection portion extended from the second anode electrode toward the one of the transmissive areas, and a third anode connection portion connecting one end of the first anode connection portion with one end of the second anode connection portion.

12. The transparent display device of claim 11, wherein the second anode connection portion is disposed at a first side of the first anode connection portion to adjoin the first anode connection portion.

13. The transparent display device of claim 12, wherein the second connection electrode is disposed at a second side of the first anode connection portion to adjoin the first anode connection portion.

14. The transparent display device of claim 11, wherein the second connection electrode includes a first transistor connection portion extended from a light-shielding layer provided between the substrate and the driving transistor toward the one of transmissive areas, and a second transistor connection portion bent from the first transistor connection portion toward the first connection electrode, having at least a portion overlapped with the third anode connection portion.

15. The transparent display device of claim 10, wherein the second connection electrode has a width narrower than that of the first connection electrode.

* * * * *